United States Patent
Hopf

(10) Patent No.: US 11,404,999 B2
(45) Date of Patent: Aug. 2, 2022

(54) METHOD FOR DETECTING A CONTACT FAULT IN A PHOTOVOLTAIC SYSTEM

(71) Applicant: SMA Solar Technology AG, Niestetal (DE)

(72) Inventor: Markus Hopf, Espenau (DE)

(73) Assignee: SMA Solar Technology AG, Niestetal (DE)

(*) Notice: Subject to any disclaimer, the term of this patent is extended or adjusted under 35 U.S.C. 154(b) by 288 days.

(21) Appl. No.: 16/697,794

(22) Filed: Nov. 27, 2019

(65) Prior Publication Data

US 2020/0099334 A1    Mar. 26, 2020

Related U.S. Application Data

(63) Continuation of application No. PCT/EP2018/064589, filed on Jun. 4, 2018.

(30) Foreign Application Priority Data

Jun. 2, 2017 (DE) .................. 10 2017 112 256.7

(51) Int. Cl.
*G01R 19/00* (2006.01)
*H02S 50/10* (2014.01)

(52) U.S. Cl.
CPC .......... *H02S 50/10* (2014.12); *G01R 19/0015* (2013.01)

(58) Field of Classification Search
None
See application file for complete search history.

(56) References Cited

U.S. PATENT DOCUMENTS 9,634,723 B1\* 4/2017 Lawal ................ H04L 25/0272
10,784,815 B2\* 9/2020 Moslehi ................... H04Q 9/00
(Continued)

FOREIGN PATENT DOCUMENTS

DE    102009044057 A1    3/2011
DE    102012104004 B3    10/2013
(Continued)

OTHER PUBLICATIONS

International Search Report dated Jul. 27, 2018 in connection with International Application PCT/EP2018/064589.

*Primary Examiner* — Daniel C Puentes
(74) *Attorney, Agent, or Firm* — Eschweiler & Potashnik, LLC

(57) ABSTRACT

A method for detecting a contact fault in a photovoltaic system is disclosed. The photovoltaic system includes an inverter and a photovoltaic generator connected to the inverter via DC current lines. The inverter includes a transmitter for coupling a first AC voltage signal having communication frequencies in a first frequency range between 125 kHz and 150 kHz into the DC current lines. A receiver is configured to couple out the first AC voltage signal and is arranged at the photovoltaic generator. A decoupling circuit is configured to decouple the impedance of the photovoltaic generator is arranged between the inverter and the photovoltaic generator, such that the photovoltaic generator is AC decoupled from a transmission path between the inverter and the decoupling circuit. The inverter communicates with the receiver via the first AC voltage signal, and wherein AC currents are measured in the DC current lines and AC voltages are measured between the DC current lines to aid in detection of a contact fault condition.

13 Claims, 4 Drawing Sheets

(56) References Cited

U.S. PATENT DOCUMENTS

2014/0062500 A1   3/2014   Behrends et al.
2016/0146857 A1   5/2016   Behrends et al.
2018/0132736 A1*  5/2018   Silverman ............ A61B 5/0261

FOREIGN PATENT DOCUMENTS

DE      102014103993 A1 *  9/2015  ............. H02S 50/10
EP         2388602 A1   11/2011

* cited by examiner

METHOD FOR DETECTING A CONTACT FAULT IN A PHOTOVOLTAIC SYSTEM

FIELD

The disclosure relates to a method for operating a photovoltaic system that is designed to feed electric power into an AC voltage grid, to an inverter for a photovoltaic system, and to such a photovoltaic system.

BACKGROUND

A contact fault in a DC current circuit of a photovoltaic system may cause considerable heating of the surroundings of the fault location and lead to formation of an electric arc. In addition to a loss of function, in particular an interruption of the DC current circuit, great damage may be caused thereby and, in an extreme case, the photovoltaic system may catch fire. Various methods for early detection of a contact fault are known in order to minimize these risks.

A contact fault is characterized in principle by a change in the series resistance of the impacted component. Many of the known contact fault detection methods are therefore based on modeling and analyzing the impedance of the DC current circuit of the photovoltaic system. A number of components of the DC current circuit, including in particular the DC current lines and the photovoltaic generators themselves, contribute to the overall impedance of the DC current circuit. Furthermore, the impedances of some of these components are temperature-dependent, and the impedance of the photovoltaic generators is subject to ageing effects, in particular what is known as potential-induced degradation. These influences may cause an impedance change that is highly similar to an impedance change caused by a contact fault. A further disadvantage of the known methods is the impedance analysis being influenced by the operation of the photovoltaic system, as a result of which the known methods are able to be performed only at times without solar irradiation onto the photovoltaic generators, that is to say in particular only at night. It should be borne in mind here that no power is available from the photovoltaic generators at these times, as a result of which an additional energy source has to be provided in order to perform the known contact fault detection methods.

WO2012000533A1 discloses a method for monitoring a photovoltaic system in which a test signal is fed into a photovoltaic generator by way of a signal transmitter, and a response signal is coupled out by way of a signal receiver, wherein a respective pair consisting of signal transmitter and signal receiver is provided in order to respectively couple in and couple out one test signal per photovoltaic generator in the case of a plurality of photovoltaic generators connected in parallel.

EP2388602A1 discloses a method for diagnosing contacts of a photovoltaic system, in which a test signal comprising a plurality of frequencies is coupled into DC current lines, a response signal is coupled out of the photovoltaic system, and a generator impedance is determined by way of evaluating the response signal. To monitor the contacts, the AC current behavior of the photovoltaic system is modeled on the basis of a magnitude and a phase of the determined generator impedance, and a series impedance that contains information about the state of the contacts is determined from the model. A comparable method is also known from EP2388603A1.

SUMMARY

The disclosure is directed to a method for detecting a contact fault in a photovoltaic system, an inverter for a photovoltaic system and a photovoltaic system equipped therewith, such that fire safety is improved and monitoring of photovoltaic systems is performed more easily and more robustly than with methods known from the prior art.

In a method according to the disclosure for detecting a contact fault in a photovoltaic system, the photovoltaic system comprises an inverter and a photovoltaic generator connected to the inverter via DC current lines. The inverter comprises a transmitter for coupling a first AC voltage signal having communication frequencies in a first frequency range between 125 and 150 kHz into the DC current lines. A receiver for coupling out the first AC voltage signal is arranged at the photovoltaic generator. A decoupling circuit for decoupling the impedance of the photovoltaic generator is furthermore arranged between the inverter and the photovoltaic generator such that the photovoltaic generator is AC decoupled from a transmission path between the inverter and the decoupling circuit. The inverter communicates with the receiver by way of the first AC voltage signal, and AC currents in, as well as AC voltages between the DC current lines, are measured.

A second AC voltage signal having measurement frequencies in a second frequency range is generated by way of the transmitter, and a frequency-dependent impedance profile is determined based on the second AC voltage signal and the measured AC currents in the second frequency range between 50 kHz and 350 kHz, for example, between 75 kHz and 200 kHz, wherein the second frequency range comprises the first frequency range. A contact fault in the photovoltaic system is then detected by way of analyzing the impedance profile.

By arranging the decoupling circuit between the inverter and the photovoltaic generator such that the receiver is located between the inverter and the decoupling circuit, and due to resonance properties of the receiver, a defined profile of the impedance of the transmission path from the transmitter to the receiver results in the first frequency range between 125 and 150 kHz. This defined profile of the impedance is used to provide a stable communication channel between the inverter and the photovoltaic generator via transmitter, DC current lines, and receiver.

The disclosure is based on the finding that the defined profile of the impedance offers considerable advantages that go beyond the provision of the stable communication channel. The first and the second frequency range in particular lie well below frequency ranges in which the DC current lines normally cause resonance effects between the inverter and the photovoltaic generator; these resonance effects generally lie well above 300 kHz. Furthermore, the decoupling means acts as a bypass for the AC voltage signals, such that these do not reach the photovoltaic generator. Resonance effects of the photovoltaic generator do not have any influence on the transmission path from the transmitter to the receiver. The impedance of the photovoltaic generator is effectively shielded from the transmission path from the inverter to the photovoltaic generator by the decoupling circuit.

The profile of the impedance in the second frequency range between 50 kHz and 350 kHz, for example, between 75 kHz and 200 kHz is thus virtually exclusively defined by the line impedances of the DC current lines and any series impedances of contact points in the path from the inverter to the decoupling means via the DC current lines. This profile of the impedance in the second frequency range is in particular substantially constant in the absence of contact points and in particular not influenced by temperature-dependent, irradiation-dependent or load-dependent impedances of the photovoltaic generator or resonance points of the DC current lines.

The method according to the disclosure may, in one embodiment, be combined with an impedance spectroscopy method that is known for example from EP2388602A1. The impedance profile determined from the measured AC currents and AC voltages is analyzed taking into account the DC voltage at the input of the inverter, for example using a model approach that is determined beforehand or in real-time. Based on this impedance profile, the series impedance of the DC current lines is determined, which includes the contact points, in particular those at the terminals of the inverter and at the decoupling means. This series impedance contains all of the information necessary for detecting a contact fault.

An inverter according to the disclosure comprises a controller that is configured to perform the method according to the disclosure. To this end, the inverter comprises a transmitter for coupling a first AC voltage signal having communication frequencies in a first frequency range between 125 and 150 kHz into the DC current lines, such that the inverter is able to communicate with the photovoltaic generator by way of the first AC voltage signal. The inverter furthermore comprises current and voltage sensors for measuring a current in or a voltage between DC current lines that are connected to DC current terminals of the inverter.

In one embodiment of the disclosure, the inverter comprises terminals for the connection of a plurality of photovoltaic generators, wherein the photovoltaic generators are connected in parallel within the inverter or in a connection unit belonging to the inverter. In this case, each photovoltaic generator is assigned a respective current measurement means within the inverter or the connection unit. The transmitter is however arranged centrally within the inverter or the connection unit such that the AC voltage signals are coupled into the DC current lines leading to the parallel-connected photovoltaic generators simultaneously. It thereby becomes particularly easy to detect contact faults for a number of separately connected photovoltaic generators without having to provide a dedicated transmitter for each of the photovoltaic generators, as is necessary in conventional inverters and corresponding methods.

A photovoltaic system according to the disclosure comprises a photovoltaic generator, a receiver for coupling out the first AC voltage signal, an inverter having the above-mentioned features according to the disclosure, and a decoupling circuit for decoupling the impedance of the photovoltaic generator from a transmission path between the inverter and the decoupling means.

In one embodiment of the photovoltaic system, the receiver may be configured as a parallel resonant circuit or as a series resonant circuit. The decoupling circuit may comprise a capacitor that is arranged in parallel with the photovoltaic generator between the DC current lines. As an alternative or in addition, the decoupling circuit may comprise a bandstop filter that is arranged in one of the DC current lines.

BRIEF DESCRIPTION OF THE FIGURES

The disclosure is described and explained in more detail below with reference to exemplary embodiments illustrated in the figures.

DETAILED DESCRIPTION

Figure 1:
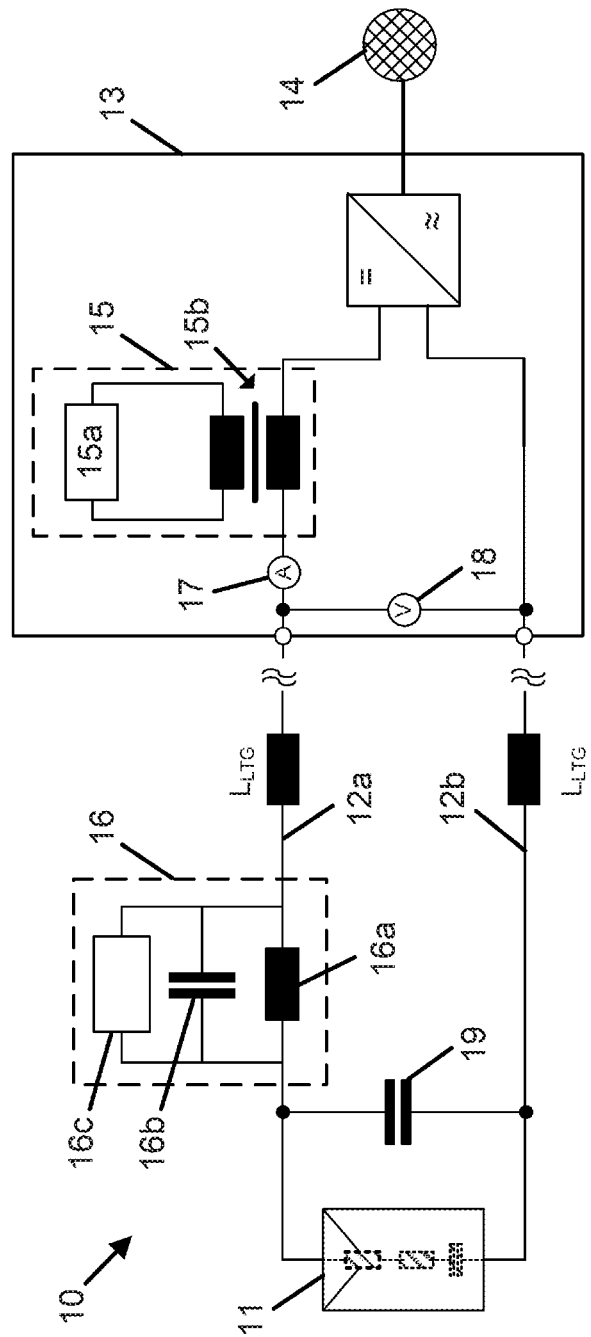
FIG. 1 shows a photovoltaic system having an inverter, a photovoltaic generator and devices for performing the method according to the disclosure.

FIG. 1 shows a photovoltaic system 10 having a photovoltaic generator (PV generator) 11 that may include one or more parallel-connected and/or series-connected PV modules. The PV generator 11 is connected to an inverter 13 via DC current lines 12a, 12b. The inverter 13 converts the DC current generated by the PV generator 11 into AC current and feeds the AC current into an AC voltage grid 14.

The inverter 13 comprises a transmitter 15 for coupling an AC voltage signal into one of the DC current lines 12a, 12b. The transmitter 15 may be designed in various forms, for example, as illustrated in FIG. 1, comprising an AC voltage source 15a that is connected to a primary side of a transformer 15b. The secondary side of the transformer 15b is arranged in the DC current line 12a such that an AC voltage signal is coupled into the DC current line 12a. Further embodiments of the transmitter 15 are known to those skilled in the art. In particular, the coupling of an AC voltage signal into one of the DC current lines 12a, 12b may be undertaken using inductive methods, such as by the transformer 15b, or using capacitive or resistive methods, such as using a capacitor or a resistor placed in or at the DC current lines 12a, 12b.

The AC voltage signal coupled in in this manner is transmitted to the PV generator 11 via the DC current lines 12a, 12b. A receiver 16 is arranged near the PV generator 11, for example in a junction box of a photovoltaic module of the PV generator 11. The receiver 16 may be designed in various forms, for example, as illustrated in FIG. 1, as an RLC parallel resonant circuit having an inductor 16a arranged in the DC current line 12a and a capacitor 16b and a resistor 16c, both of which are arranged electrically in parallel with the inductor 16a. Other embodiments are conceivable for the receiver 16, for example a series resonant circuit. In particular, the retrieving of the AC voltage signal may be undertaken using inductive methods, such as by the transformer 16b, or using capacitive or resistive methods, such as using a capacitor or a resistor placed in or at the DC current lines 12a, 12b. The AC voltage signal to be transmitted to the PV generator 11 may be tapped off at the receiver 16, for example in the form of a voltage drop across the resistor 16c or in parallel with the receiver 16 and a decoupling means 19, by way of a voltage measurement (not shown), and subsequently forwarded to the photovoltaic generator 11.

The frequency profile of a transfer function for the AC voltage signal is directly dependent on the frequency-dependent impedance profile of the transmission path between the transmitter 15 and the receiver 16. The impedance of the transmission path is composed of a plurality of partial impedances, in particular line impedances $L_{LTG}$ of the DC current lines 12a, 12b, any series impedances of contact points, and, in conventional photovoltaic systems, the impedance of the PV generator 11 as well. The decoupling means 19, which is arranged between the receiver 16 and the PV generator 11, serves to decouple the complex and potentially volatile impedance of the PV generator 11, such that the impedance of the PV generator 11 is AC decoupled from the transmission path between the transmitter 15 and the receiver 16. A defined impedance profile is thereby generated between the transmitter 15 and the receiver 16. This impedance profile is substantially constant, in particular in the absence of contact faults. The resulting transmission path having a defined impedance profile in a selected frequency range is particularly well-suited as a communication path between the transmitter 15 and the receiver 16. As a result, it is possible to calculate and specify a defined and limited input level range, and the ratio between the minimum input level and the maximum input level becomes smaller.

The AC voltage signal transmitted by the transmitter 15 to the receiver 16 via the DC current lines 12a, 12b may be used for unidirectional communication with a further electrical or electronic circuit arranged on the PV generator 11 (not shown in FIG. 1). By way of example, a disconnector switch or short-circuit switch may be arranged at the PV generator 11 and operated depending on the AC voltage signal received by receiver 16, such that its switching state is controlled by way of an AC voltage signal, which may be a coded signal coupled into the DC current lines 12a, 12b by the transmitter 15.

The inverter 13 furthermore comprises a current measurement device or circuit 17 and a voltage measurement device or circuit 18. The current measurement device 17 is arranged in one of the DC current lines 12a, 12b and configured to measure the current flowing in the DC current lines 12a, 12b. In addition to the DC current generated by the PV generator 11, this current may comprise AC current components that are induced in the DC current lines 12a, 12b due to the AC voltage signal which is coupled in by the transmitter 15. As an alternative, the inverter 13 may comprise a plurality of current measurement devices 17, for example a current measurement device 17 optimized for measuring DC currents and at least one further current measurement device 17 optimized for measuring AC currents in the frequency range of the second AC voltage signal.

The voltage measurement device 18 is arranged between the DC current lines 12a, 12b and is configured to measure the potential difference between the DC current lines 12a and 12b. Like in the case of the current measurement device 17, the inverter 13 may also comprise a plurality of voltage measurement device 18 that are each optimized for measuring DC voltages or AC voltages in one or more frequency ranges.

A decoupling circuit 19 is arranged on the PV generator 11. The decoupling circuit 19 offers a bypass for the AC currents generated by the transmitter 15 in the DC current lines 12a, 12b, such that these AC currents do not have to flow via the PV generator 11, and the PV generator 11 is thus AC decoupled with regard to AC voltages and AC currents in the DC current lines 12a, 12b.

Figure 2:
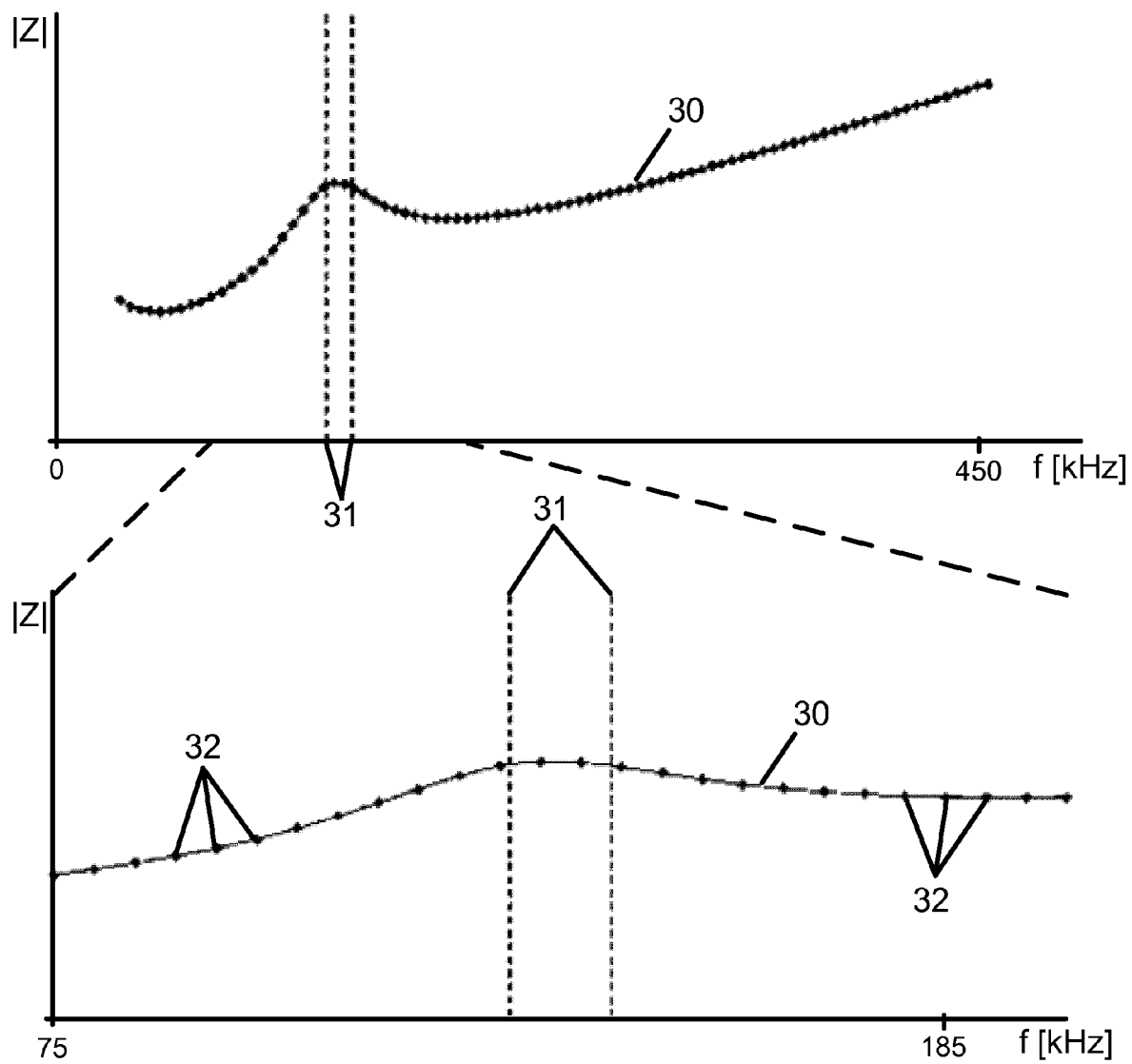
FIG. 2 shows a frequency-dependent impedance profile of a transmission path between the inverter and the photovoltaic generator.

FIG. 2 shows an example impedance profile 30 of the magnitude of the impedance |Z| of the transmission path comprising the DC current lines 12a, 12b, the receiver 16 and the decoupling circuit 19, and possibly contact points. Due to the decoupling circuit 19, the impedance profile 30 of the impedance |Z| is not influenced by the impedance of the PV generator 11.

The upper part of FIG. 2 shows the impedance profile 30 of the magnitude of the impedance |Z| over a frequency range of roughly 50 kHz to 450 kHz. A first AC voltage signal for communication between the transmitter 15 and the receiver 16 may be fed into the DC current lines 12a, 12b by the transmitter 15 and have selected communication frequencies 31. By way of example, communication frequencies may lie in the range of roughly 131 kHz and 146 kHz, as illustrated by vertical dotted lines in FIG. 2.

The lower part of FIG. 2 shows a closer look at a part of the impedance profile 30 of the magnitude of the impedance |Z| over a frequency range of roughly 75 kHz to 200 kHz. To determine the impedance profile 30 in this frequency range, a second AC voltage signal may be fed into the DC current lines 12a, 12b by the transmitter 15. The second AC voltage signal may have different measurement frequencies 32. It may comprise a single one of the measurement frequencies 32 only at a time in order to determine the magnitude of the impedance |Z| at this individual measurement frequency. In principle, however, the measured signal may also comprise a plurality of or all of the measurement frequencies 32 at the same time. The impedance profile 30 is obtained by multiple determinations of the impedance |Z| at different measurement frequencies 32, wherein the measurement frequencies 32 extend over a frequency range that comprises the communication frequencies 31 and may, in one embodiment, extend substantially symmetrically around the communication frequencies 31.

By arranging the receiver 16 and the decoupling circuit 19 at the PV generator 11, the impedance profile 30, in particular in the region of the communication frequencies 31, has a defined profile that is neither influenced by the operation-dependent impedance of the PV generator 11, nor by any higher-frequency resonances of the DC current lines 12a, 12b. This is advantageous, on the one hand, to ensure stable communication between the transmitter 15 and the receiver 16. On the other hand, any contact error brings about a change in the series impedance of the DC current lines 12a, 12b, which in turn has a direct effect on the defined impedance profile 30, such that contact errors may be detected as a change in the impedance profile 30. The corresponding method is explained below in connection with FIG. 3.

Figure 3:
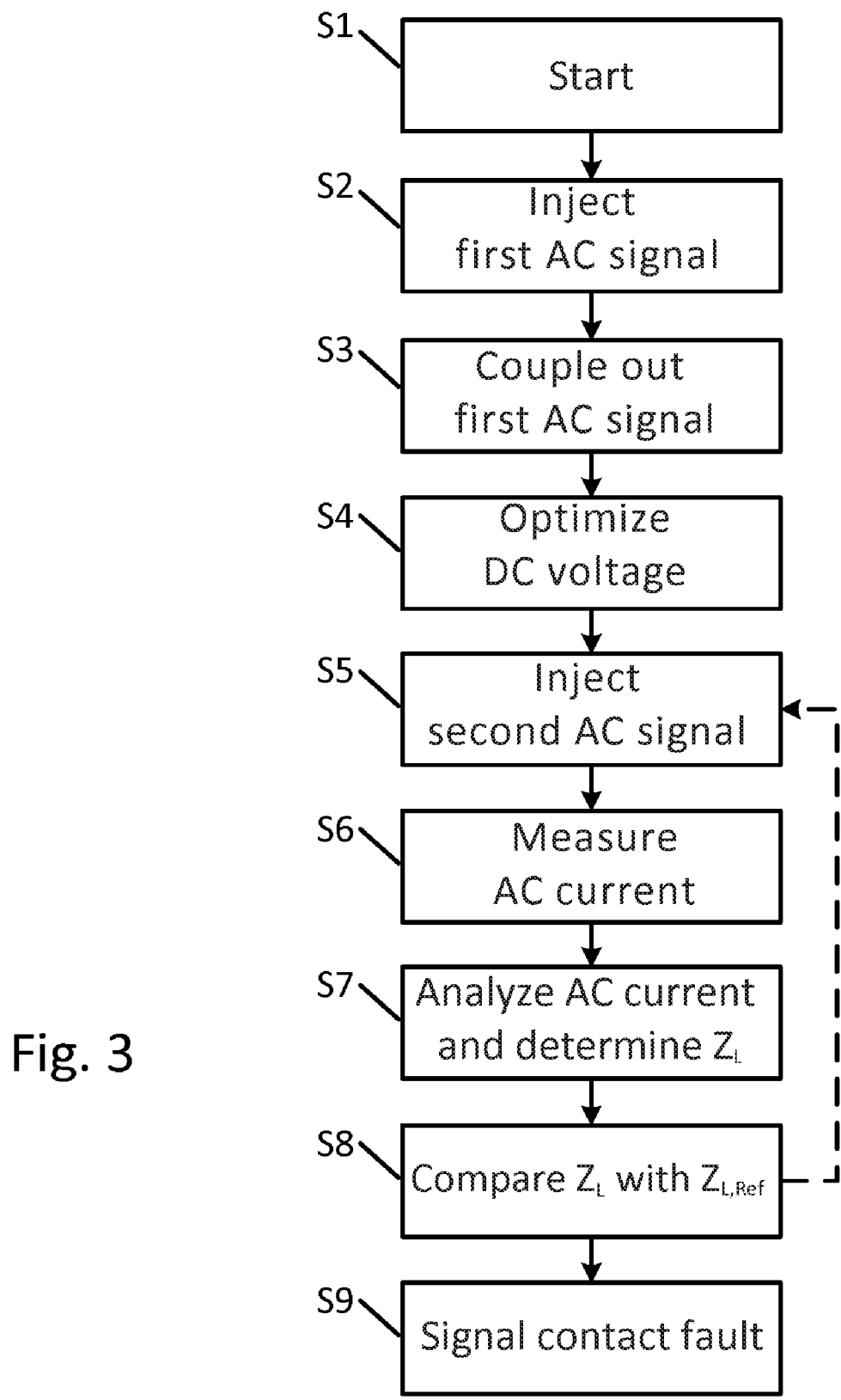
FIG. 3 shows a flowchart of a method according to the disclosure.

FIG. 3 shows a flowchart of one embodiment of the method according to the disclosure. The method starts at S1, in which the photovoltaic system 10 goes into operation. At S2, a first AC voltage signal (first AC signal) in a first frequency range is injected into the DC current lines 12a, 12b by the transmitter 15. At S3, the first AC voltage signal is coupled out by the receiver 16. Depending on the first AC signal, an electrical or electronic circuit at the PV generator 11 may switch a disconnection switch and/or short-circuit switch into a state that allows electric power to be transmitted from the PV generator 11 to the inverter 13. At S4, the electric power of the PV generator 11 may be optimized by setting the DC voltage at the input of the inverter 13 such that the PV generator 11 is operated at a desired working point, for example at a maximum power point of a current-voltage characteristic curve of the PV generator 11.

At S5, a second AC voltage signal (second AC signal) in a second frequency range is injected into the DC current lines 12a, 12b by the transmitter 15. The frequency of the second AC current signal is varied over the second frequency range and comprises the first frequency range. At S6, the AC current induced due to the second AC voltage signal in the DC current lines 12a, 12b is measured. At S7, this AC current is analyzed by way of a model approach determined beforehand or in real-time, taking into account the measured DC voltage at the input of the inverter 13. The impedance profile 30 is thus obtained by multiple determinations of the ratio of the AC voltage signal and the measured AC current, i.e. of the impedance |Z| at a range of frequencies 32. The series impedance $Z_L$ of the DC current lines 12a, 12b is determined from the impedance profile 30. Then, at S8, the determined series impedance $Z_L$ of the DC current lines 12a, 12b is compared with a reference series impedance $Z_{L,Ref}$, which was determined for example in a previous run-through of the method or purely analytically, assuming fault-free DC current lines 12a, 12b without any contact faults. As an alternative or in addition, at S8, the impedance profile 30 determined at S7 may be subjected to pattern recognition in order to detect a distinct pattern of a contact fault within the impedance profile 30. If, at S8, a significant change in the series impedance is established or a pattern generated by a contact fault is detected, at S9, the presence of a contact fault is signaled in appropriate form, for example to an operator of the photovoltaic system. The photovoltaic system 10 is then possibly switched off, in particular by interrupting the DC current in the DC current lines 12a, 12b. If, at S8, no change in the series impedance exceeding a threshold is determined or no pattern generated by a contact fault is detected, the photovoltaic system 10 may continue to operate. The method returns to act S5 and updates the determined series impedance $Z_L$ in a further run-through of the method that is performed immediately or a certain amount of time later, for example after a few minutes or hours.

Figure 4:
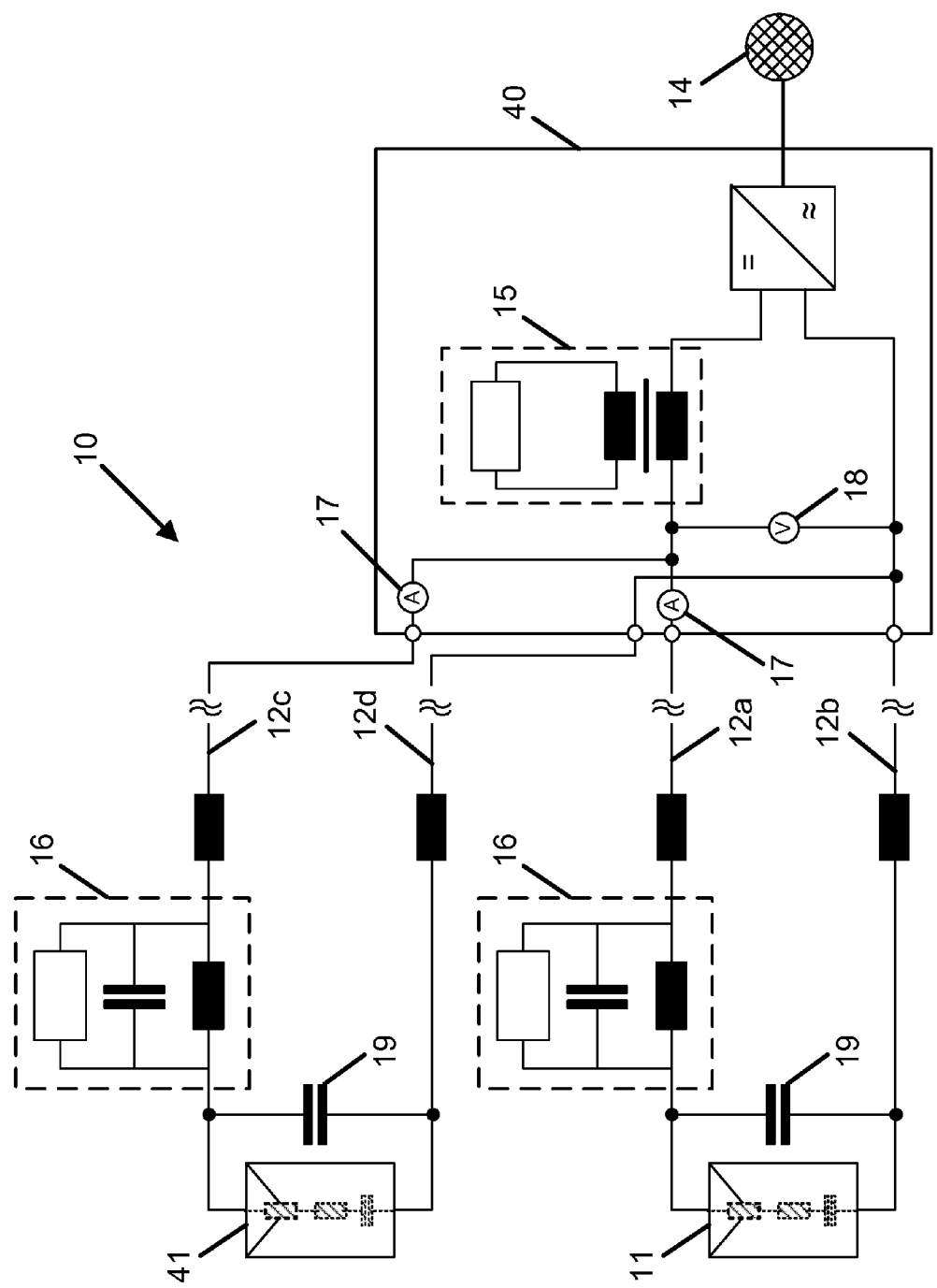
FIG. 4 shows a photovoltaic system.

FIG. 4 shows a further embodiment of a photovoltaic system 10 having an inverter 40 that comprises further DC current inputs such that, in addition to the PV generator 11, a further PV generator 41 may be connected to the inverter 40 via further DC current lines 12c, 12d. The further PV generator 41 is connected in parallel with the PV generator 11 within the inverter 40; as an alternative, this parallel connection may also take place outside the inverter 40, for example in an additional connection unit, not shown here, for combining a plurality of PV generators 11, 41.

To detect contact faults in the DC current lines 12a, 12b, 12c, 12d running to the PV generators 11, 41, a receiver 16, a decoupling circuit 19, and a current measurement device 17 may be arranged at each connected PV generator 11, 41. It then becomes particularly simple to detect contact faults, since overall just one transmitter 15 and just one voltage measurement device 18 is required to determine the impedance profiles of the transmission paths between the transmitter 15 and the plurality of PV generators 11, 41.

The invention claimed is:

1. A method for detecting a contact fault in a photovoltaic system, wherein the photovoltaic system comprises an inverter and a photovoltaic generator connected to the inverter via DC current lines, wherein the inverter comprises a transmitter for coupling a first AC voltage signal having communication frequencies in a first frequency range between 125 kHz and 150 kHz into the DC current lines, wherein a receiver configured to receive the first AC voltage signal is arranged at the photovoltaic generator, and a decoupling circuit configured to decouple an impedance of the photovoltaic generator is arranged between the inverter and the photovoltaic generator, such that the photovoltaic generator is AC decoupled from a transmission path between the inverter and the decoupling circuit, wherein the inverter communicates with the receiver via the first AC voltage signal, and wherein AC currents are measured in the DC current lines and AC voltages are measured between the DC current lines, the method comprising:

generating a second AC voltage signal having measurement frequencies in a second frequency range via the transmitter;

determining a frequency-dependent impedance profile based on the second AC voltage signal and the measured AC currents in the second frequency range between 50 kHz and 350 kHz, wherein the second frequency range comprises the first frequency range; and detecting whether a contact fault condition exists in the photovoltaic system by analyzing the frequency-dependent impedance profile.

2. The method as claimed in claim 1, wherein the first AC voltage signal and the second AC voltage signal are coupled into the DC current lines concurrently.

3. The method as claimed in claims 1 or 2, wherein the decoupling circuit is in a parallel configuration with respect to the photovoltaic generator.

4. An inverter for a photovoltaic system, wherein the inverter comprises:
a controller; and
a transmitter configured to couple a first AC voltage signal having communication frequencies in a first frequency range between 125 kHz and 150 kHz into DC current lines that are configured to connect the inverter to a photovoltaic generator, wherein the transmitter is configured to couple a second AC voltage signal having measurement frequencies in a second frequency range between 50 kHz and 350 kHz into the DC current lines.

5. The inverter as claimed in claim 4, wherein the inverter comprises terminals for a connection of a plurality of photovoltaic generators via the DC current lines, wherein the photovoltaic generators are connected in parallel within a housing of the inverter or in a connection device belonging to and interfacing with the inverter, and wherein each photovoltaic generator is assigned a respective current measurement device within the inverter or the connection device, and wherein the transmitter is arranged within the inverter or within the connection device such that the first AC voltage signal and the second AC voltage signal are coupled into the DC current lines leading to the parallel-connected photovoltaic generators concurrently.

6. The inverter of claim 4, wherein the transmitter comprises a transformer configured to receive an AC voltage signal at a primary winding thereof and another AC voltage signal related to the AC voltage signal into one of the DC current lines via a secondary winding thereof.

7. The inverter as claimed in claim 4, wherein the first AC voltage signal and the second AC voltage signal are coupled into the DC current lines concurrently.

8. A photovoltaic system, comprising:
a photovoltaic generator;
a receiver configured to receive a first AC voltage signal from DC current lines;
an inverter comprising a controller and having a transmitter associated therewith configured to couple the first AC voltage signal into the DC current lines wherein the first AC voltage signal has a first frequency range; and
a decoupling circuit configured to decouple an impedance of the photovoltaic generator from a transmission path comprising the DC current lines between the inverter and the decoupling circuit such that the photovoltaic generator is AC decoupled from the transmission path, wherein the receiver is arranged at the photovoltaic generator, and wherein the inverter communicates with the photovoltaic generator via the transmitter, the first AC voltage signal, and the receiver, and wherein AC currents are measured in the DC current lines and AC voltages are measured between the DC current lines, and wherein the controller is configured to:
generate a second AC voltage signal having measurement frequencies in a second frequency range via the transmitter;
determine a frequency-dependent impedance profile based on the second AC voltage signal and the measured AC currents in the second frequency range between 50 kHz and 350 kHz, wherein the second frequency range comprises the first frequency range; and
detect whether a contact fault condition exists in the photovoltaic system when the inverter is coupled to the photovoltaic generator via the DC current lines by analyzing the frequency-dependent impedance profile.

9. The photovoltaic system as claimed in claim 8, wherein the receiver is configured as a parallel resonant circuit or a series resonant circuit.

10. The photovoltaic system as claimed in claim 8, wherein the decoupling circuit comprises a capacitor that is configured in parallel with the photovoltaic generator between the DC current lines.

11. The photovoltaic system as claimed in claim 8, wherein the decoupling circuit comprises a bandstop filter that is arranged in one of the DC current lines.

12. The photovoltaic system as claimed in claim 8, wherein the first AC voltage signal and the second AC voltage signal are coupled into the DC current lines concurrently.

13. The photovoltaic system as claimed in claims 8 or 12, wherein the decoupling circuit is in a parallel configuration with respect to the photovoltaic generator.

\* \* \* \* \*